United States Patent [19]
Hiraga

[11] 4,440,493
[45] Apr. 3, 1984

[54] PRINTING APPARATUS
[75] Inventor: Ryozo Hiraga, Yokohama, Japan
[73] Assignee: Canon Kabushiki Kaisha, Tokyo, Japan
[21] Appl. No.: 471,062
[22] Filed: Mar. 2, 1983

Related U.S. Application Data
[63] Continuation of Ser. No. 385,980, Jun. 7, 1982, abandoned, which is a continuation of Ser. No. 260,392, May 4, 1981, abandoned.

[30] Foreign Application Priority Data

| May 14, 1980 | [JP] | Japan | 55-63784 |
|---|---|---|---|
| May 14, 1980 | [JP] | Japan | 55-63785 |
| May 14, 1980 | [JP] | Japan | 55-63786 |
| May 14, 1980 | [JP] | Japan | 55-63787 |
| May 14, 1980 | [JP] | Japan | 55-63788 |

[51] Int. Cl.³ .............................................. G03B 27/04
[52] U.S. Cl. ........................................ 355/86; 355/95
[58] Field of Search ...................... 355/78, 79, 53, 95, 355/86

[56] References Cited
U.S. PATENT DOCUMENTS

| 2,382,674 | 8/1945 | Staud. | |
| 3,521,058 | 7/1970 | Mittelstedt. | |
| 3,742,229 | 6/1973 | Smith, et al. | |
| 3,844,655 | 10/1974 | Johannsmeier | 355/78 |
| 4,105,328 | 8/1978 | Wasson et al. | 355/78 |

Primary Examiner—Monroe H. Hayes
Attorney, Agent, or Firm—Fitzpatrick, Cella, Harper & Scinto

[57] ABSTRACT

In an apparatus for printing a mask pattern on a wafer for manufacturing a semiconductor circuit element, the exposure of the mask pattern is effected by being divided into a plurality of times. Each time the divided exposure is effected, the relative positional relation of the mask pattern and the wafer is made to differ by a minute amount. Thereby, a mask pattern thinner than the line width of the mask pattern is formed on the wafer.

5 Claims, 22 Drawing Figures

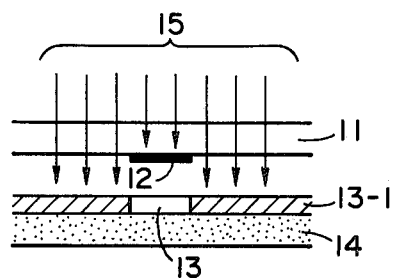
(a-1)
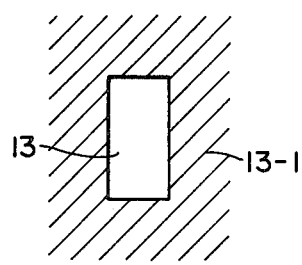
(a-2)
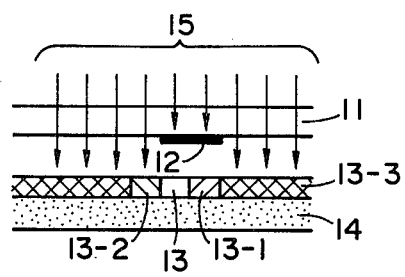
(b-1)
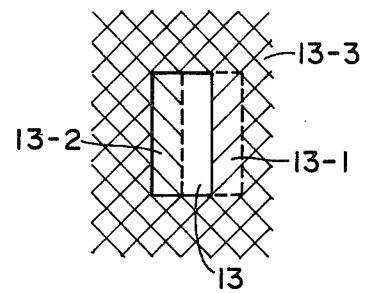
(b-2)
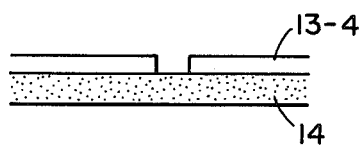
(c)
FIG. 1

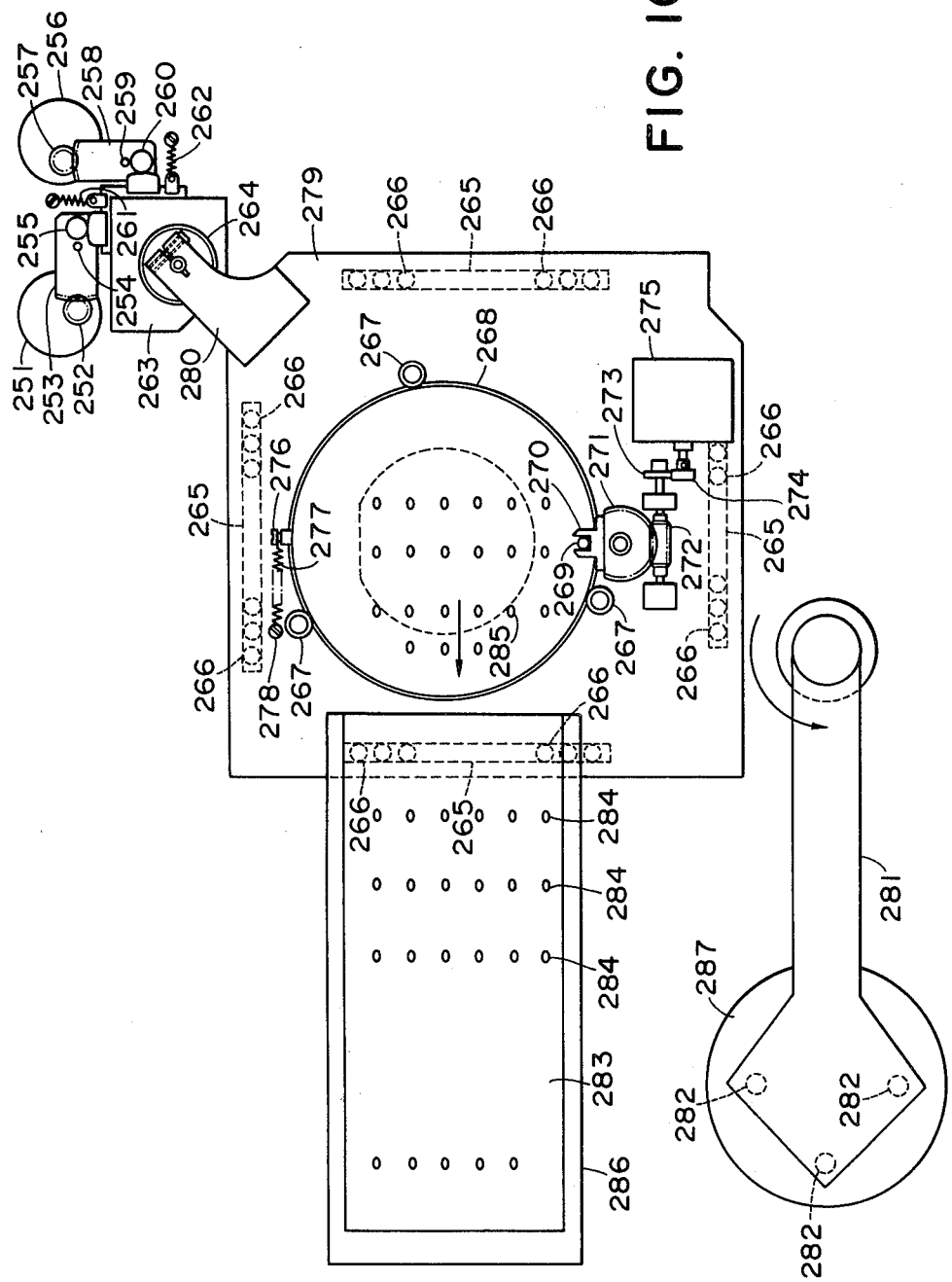

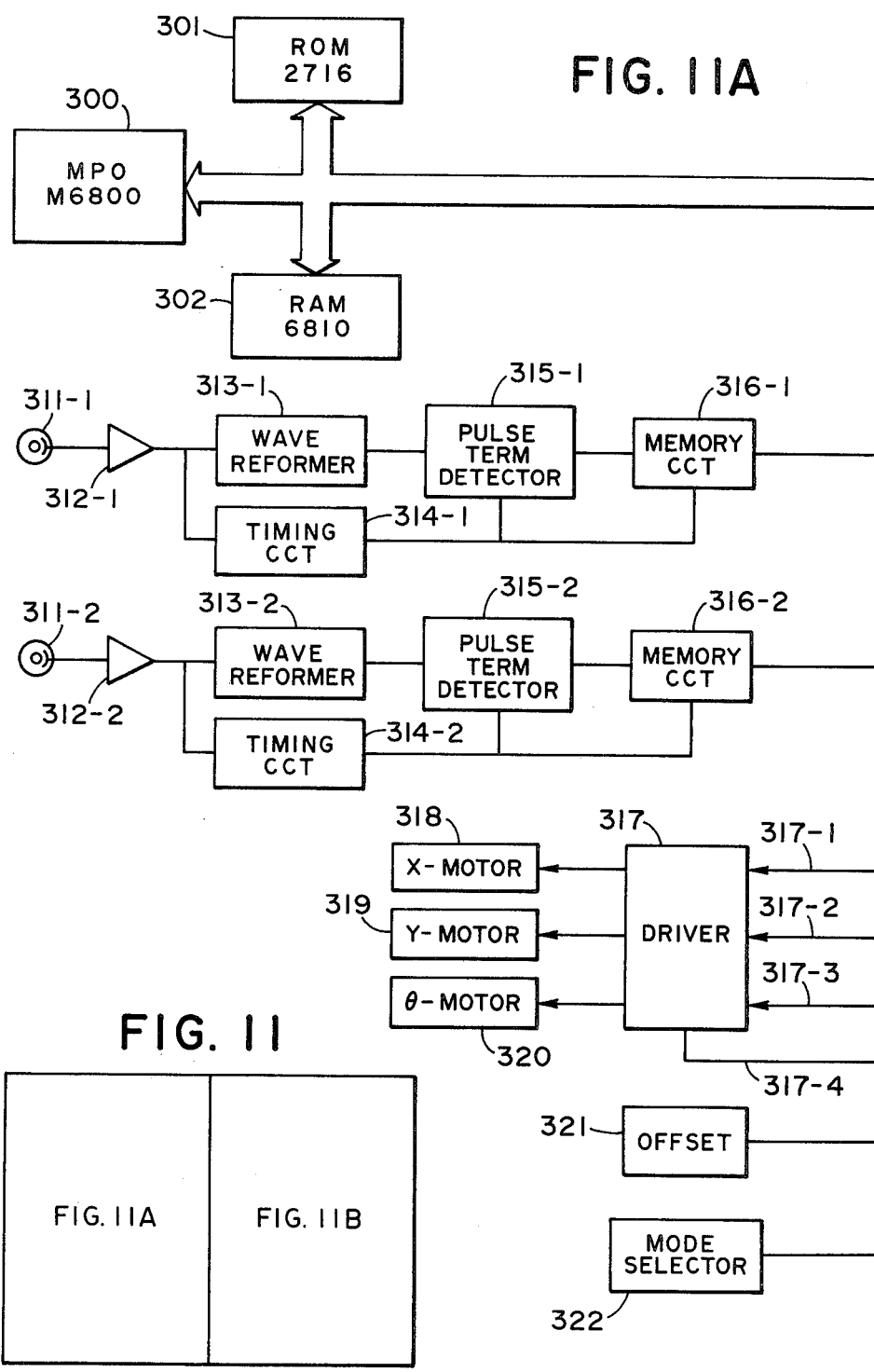

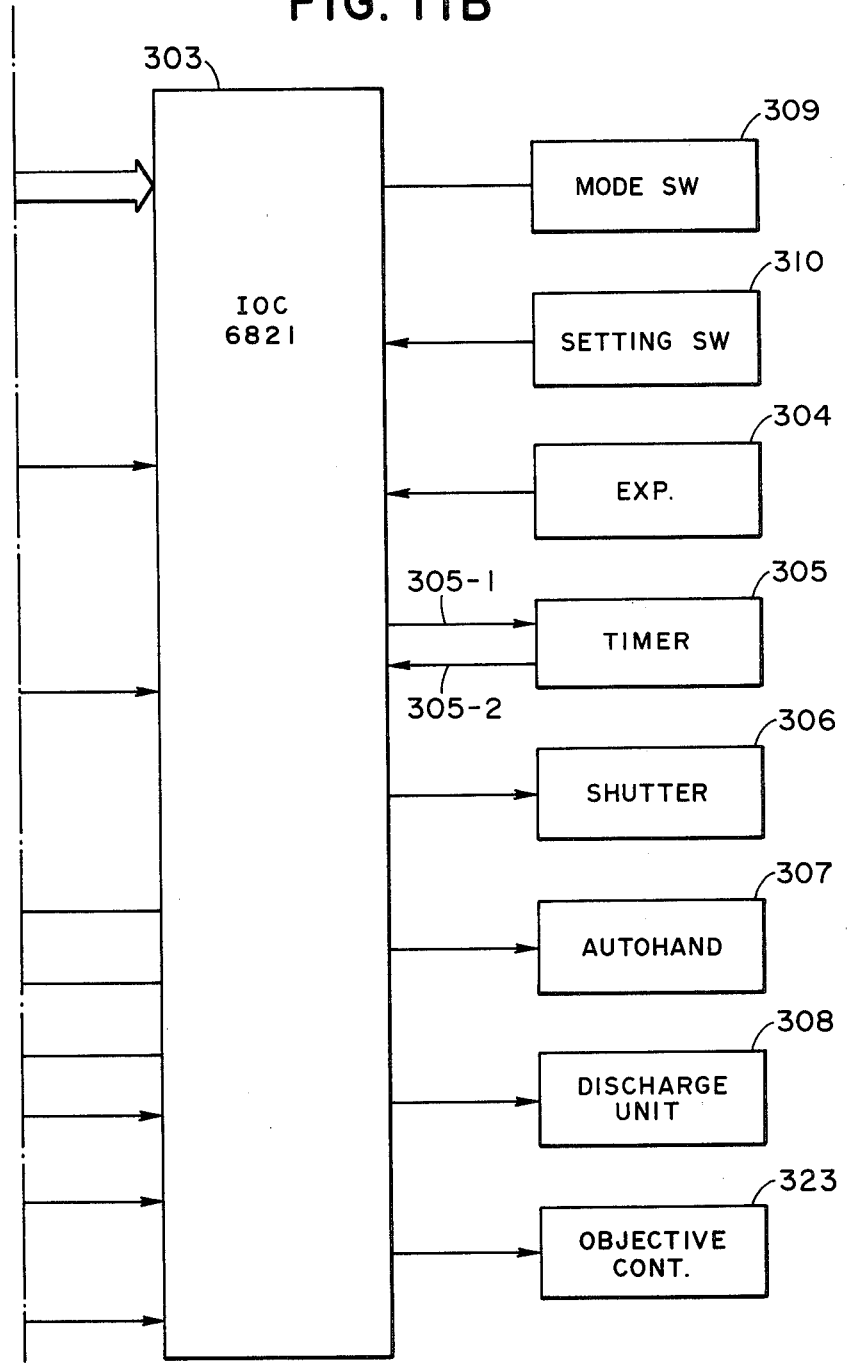

PRINTING APPARATUS

This application is a continuation of application Ser. No. 385,980 filed June 7, 1982, now abandoned, which was a continuation of application Ser. No. 260,392, filed May 4, 1981, now abandoned.

BACKGROUND OF THE INVENTION

1. Field of the Invention

This invention relates to an apparatus for forming a mask pattern on a wafer for manufacturing a semiconductor circuit element and printing this pattern on the wafer.

2. Description of the Prior Art

Methods of forming a mask pattern on a wafer include the so-called contact print method whereby a mask and a wafer are brought into contact with each other and printing light is applied from the mask side, the proximity method whereby a mask and a wafer are spaced apart from each other by a minute gap and printing light is applied from the mask side, and the method whereby the image of a mask irradiated with printing light is formed on a wafer by a lens or a reflection imaging system. The printing apparatus of the present invention is applicable to any of these methods.

The printing apparatus according to the prior art has adopted a method whereby a mask pattern and a wafer are brought into a fixed relationship and the mask pattern is printed on the wafer by one exposure.

SUMMARY OF THE INVENTION

The present invention is concerned with an apparatus in which, unlike the above-described apparatus of the prior art, the exposure time is divided into a plurality of times and during each exposure time, a mask pattern is moved relative to a wafer by a predetermined minute amount to thereby effect printing. The predetermined minute amount is a predetermined amount smaller than at least the line width of the mask pattern formed on a wafer, and the divided exposure times need not be equal to each other.

This plurality exposure method will be described by reference to the accompanying drawings by restricting it particularly to a two-exposure method.

In FIG. 1, reference numeral 11 designates a mask. This mask 11 is formed with an opaque portion 12 for forming a pattern. Designated by 14 is a wafer on which a negative type sensitive layer is formed. Now, the mask 11 and the wafer 14 are subjected to a first exposure by printing light 15. This condition is shown in FIG. 1(a-1). The condition after termination of the first exposure is shown in FIG. 1(a-2). Referennce numeral 13 designates a non-exposed portion corresponding to the opaque portion 12. Reference numeral 13-1 denotes a portion exposed by the first exposure. The condition of a second exposure is shown in FIG. 1(b-1). The mask 11 is moved rightwardly relative to the wafer by a predetermined amount, or in this Figure, ½ of the width of the opaque portion 12. In this condition, the second exposure is effected. The condition after termination of the second exposure is shown in FIG. 1(b-2). Reference numeral 13 designates a non-exposed portion, reference numerals 13-1 and 13-2 denote portions subjected to one exposure, and reference numeral 13-3 designates a portion subjected to two exposures. When this is developed, there is formed a groove having a line width thinner than the opaque portion 12, as shown in FIG. 1(c).

FIGS. 2A and 2B are views copied from microscopic photographs showing wafers prepared by the prior art printing method and the two-time printing method, respectively. In the wafer shown in FIG. 2A, the line width 2 $\mu$m is not resolved, whereas in the wafer of FIG. 2B prepared by the two-exposure method, 2 $\mu$m is resolved.

The data of this experiment will be shown below.

| Mask: | Prior art method line width 2 $\mu$m |
| --- | --- |
| | Two-exposure method line width 4 $\mu$m |
| Wafer: | Photoresist OMR-80 sold by Tokyo Applied Chemistry Co., Ltd. was applied to a thickness of 1 $\mu$m on SiO$_2$ substrate and pre-baked at 83° C. for 25 minutes |
| Treatment: | The wafer was developed for 60 seconds by developing liquid for OMR-80 sold by Tokyo Applied Chemistry Co., Ltd., whereafter it was rinsed for 60 seconds by rinse for OMR-80. |
| Printing Conditions: | Gap between mask and wafer   10 $\mu$m |
| | Exposure time |
| | Prior art method   0.8 sec. |
| | Two-exposure method |
| | 1st time   0.8 sec. |
| | 2nd time   0.8 sec. |

It is an object of the present invention to provide a printing apparatus in which a plural-exposure method is effected.

The invention will become fully apparent from the following detailed description thereof taken in conjunction with the accompanying drawings.

BRIEF DESCRIPTION OF THE DRAWINGS

FIG. 1 illustrates the dual exposure method.

FIG. 10 shows a wafer supporting means.

FIG. 11 shows how FIGS. 11A and 11B are related to each other.

FIGS. 11A and 11B show an electric circuit diagram.

FIGS. 12A, 12B and 12C show a flow chart.

DESCRIPTION OF THE PREFERRED EMBODIMENT

Figure 2A:
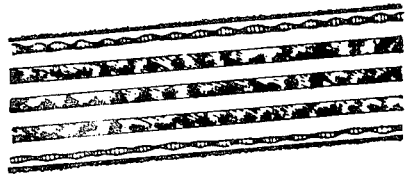
FIGS. 2A and 2B are views copied from microscopic photographs showing line patterns formed by the prior art one exposure method and the dual exposure method, respectively.
Figure 2B:
Figure 3:
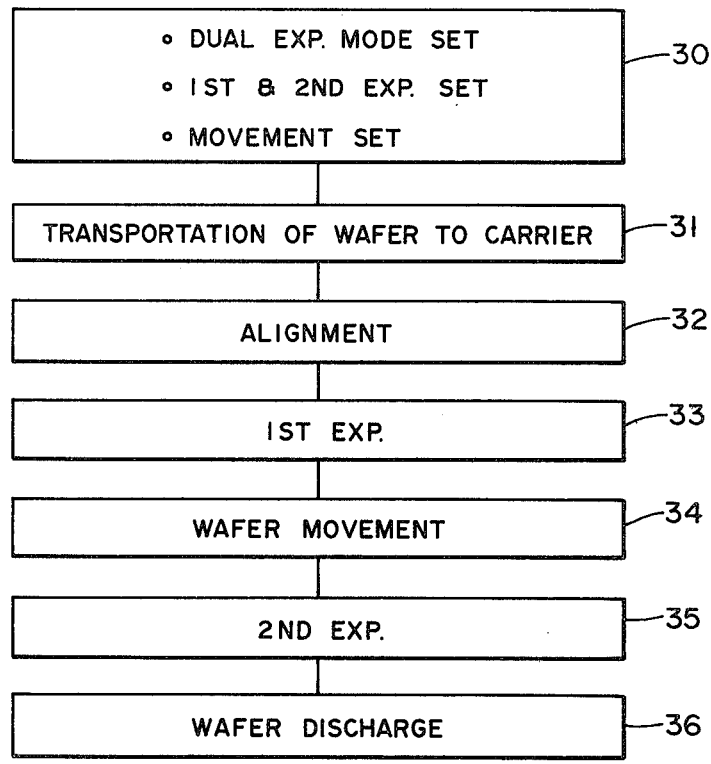
FIG. 3 is a flow chart of basic operation of the apparatus according to the present invention.

The basic operation of the apparatus according to the present invention will hereinafter be described by reference to FIG. 3 and so on. The following description of the basic operation will be made with a plurality of circuit lights restricted to dual exposure.

Designated by 30 is a condition setting stage. At this stage, the mode is changed from one exposure mode to dual exposure mode by a selector switch. Also, the amounts of a first exposure and a second exposure are set. The sum of these two exposures is greater than the amount of exposure during the one exposure mode. Further, the movement amount of the second exposure for the mutual positional relation between a mask pattern and a wafer pattern during the first exposure is set. Denoted by 31 is a stage at which a wafer is transported to a wafer carrier by a wafer transporting machine. Designated by 32 is an alignment stage at which the mask and wafer are aligned to a predetermined positional relation, and denoted by 33 is a first exposure stage at which the mask is irradiated with printing light. To prevent the wafer from being discharged before this stage and after termination of the first exposure stage, it is necessary to render a wafer discharge signal generator inoperative at the end of the first exposure simultaneously with the setting of the dual exposure mode. After this first exposure, the wafer is moved by the previously set movement amount relative to the mask pattern. This movement may be effected by moving the wafer relative to the mask over a given predetermined amount manually or by the use of a wafer driving device, or alternatively by moving the wafer by the driving device and stopping the movement when the given predetermined amount has been reached by monitoring the moved position of the wafer by monitoring means. After this predetermined amount of movement, the second exposure is effected. Thereafter, the wafer is discharged.

Figure 4:
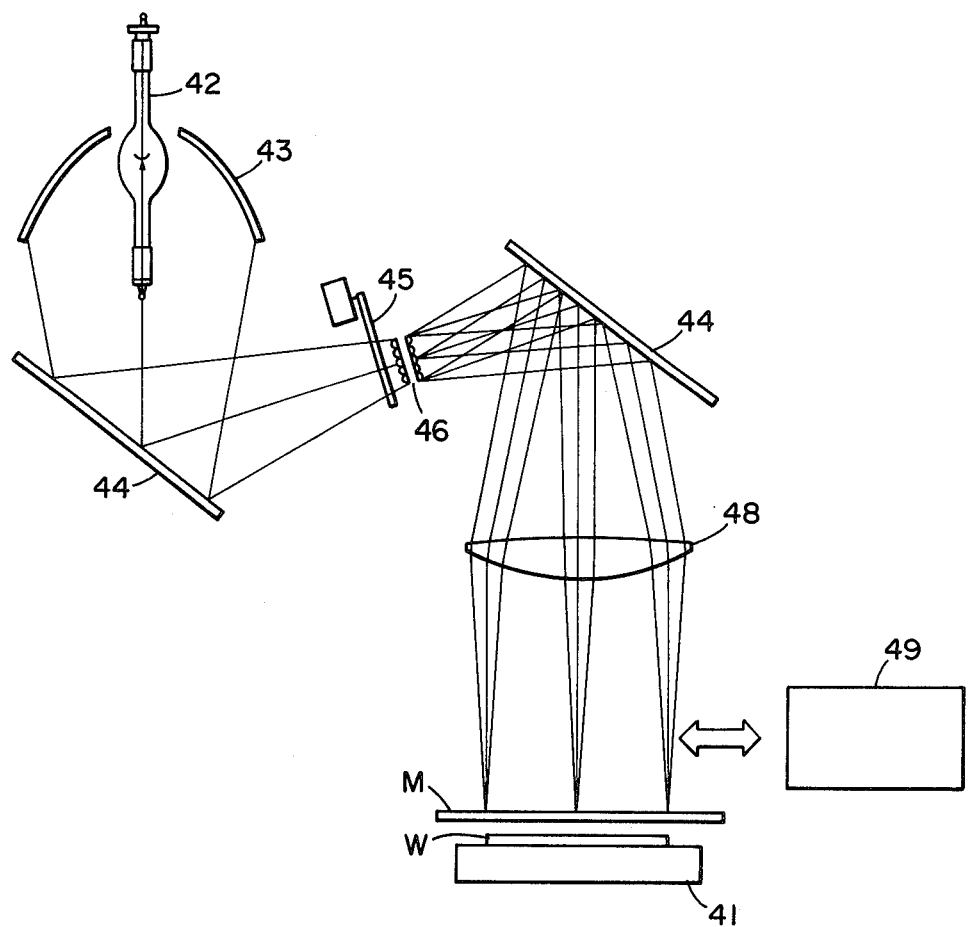
FIG. 4 illustrates the printing optical system of the apparatus to which the present invention is applied.

An embodiment of the present invention will now be described by reference to FIG. 4 and so on. FIG. 4 shows a printing optical system. Designated by M is a mask supported by a fixed mask supporting means, not shown. Adjacent to this mask M, a wafer W is supported on a wafer supporting means 41. The printing optical system of FIG. 4 further includes a printing light source 42, a reflector shade 43, light path deflecting mirrors 44, a shutter 45 for controlling the exposure time, a fly's eye lens 46 for preventing interference, and a condenser lens 48. These members 42–48 together constitute the printing optical system. The mask is illuminated by this printing optical system and the mask pattern is formed on the wafer W. Designated by 49 is photoelectric detecting optical system inserted in place of the printing optical system prior to printing.

Figure 5:
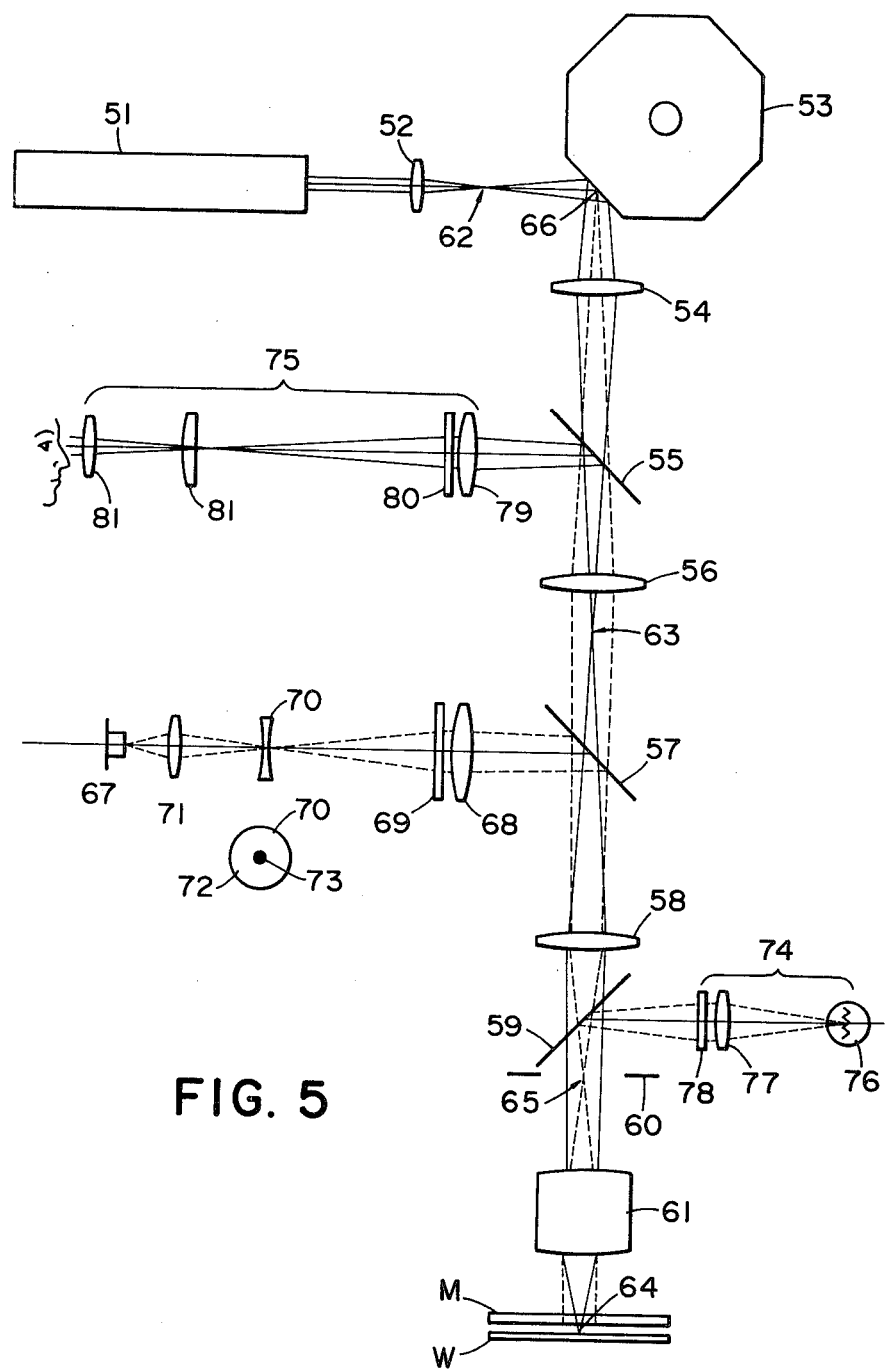
FIG. 5 shows an alignment optical system.

This photoelectric detecting optical system is particularly shown in FIG. 5.

The photoelectric detecting system shown in FIG. 5 is disclosed in Japanese Patent Application No. 49109/1976 filed on Apr. 28, 1976 by the applicant and entitled "Scanning Type Light Detecting Device". This photoelectric detecting system is of the type which scans a mask and a wafer by a scanning spot, more specifically, a laser spot.

The photoelectric detecting system of FIG. 5 includes a laser light source 51, a condenser lens 52, a rotatable polygonal mirror 53, a relay lens 54, a beam splitter 55 for splitting a light for a visual confirming optical system which will hereinafter be described, a field lens 56, a beam splitter 57 for splitting light for the photoelectric detecting optical system which will hereinafter be described, a relay lens 58, a beam splitter 59 for directing the light from an illuminating optical system for visual observation which will hereinafter be described, and the pupil 60 of an objective lens 61. These constitute a laser beam scanning optical system. The conjugate relation of the laser beam itself is as follows. The laser beam is once condensed at a position 62 in front of the rotatable polygonal mirror 53 by the condenser lens 52. The spot diameter of the laser beam at the position 62 is determined by the diameter D of the incident laser beam and the focal length $f_2$ of the condenser lens 52. If the laser beam exhibits a uniform distribution in its diameter D, the diameter d of the laser spot will be shown by $$d = 2.44\lambda \frac{f_2}{D}.$$

The laser beam diverging from the position 62 is reflected by the rotatable polygonal mirror 53, whereafter it passes through the relay lens 54 and is once imaged at a point 63 near the field lens 56. The light further passes through the relay lens 58 and the objective lens 61 and is imaged at a position 64 corresponding to the surfaces of the mask and wafer.

Accordingly, in FIG. 5, the positions 62, 63 and 64 are conjugate to one another. The laser beam condensed at the position 64 scans over the surfaces of the mask and wafer with the rotation of the rotatable polygonal mirror 53.

The imaging relation of the pupil of the optical system of FIG. 5, as well as the above-described conjugate relation of the scanning beam on the actual object surface, is important. The pupil of the objective lens 61 is indicated at 60, and the point 65 on the optical axis which is the central point of the pupil 60 and the reflective point 66 of the rotatable polygon mirror are conjugate to each other. That is, as regards the incidence of the laser beam onto the objective lens, the arrangement of FIG. 5 is equivalent to one in which the rotatable polygonal mirror 53 is disposed at the position of the pupil 60.

When a reflecting object like a wafer is to be observed, a telecentric objective lens is used. The objective lens 61 of FIG. 5 adopts a telecentric arrangement, namely, an arrangement in which the pupil 60 determining the light beam passing through the optical system is disposed at the forward focus position of the lens 61. The center 65 of the pupil position 60 which is also the forward focus of the objective lens 61 is conjugate to the laser reflection point 66 of the rotatable polygonal mirror 53 as previously described and therefore, it performs the function as if the scanning beam is produced from there. The principal ray which provides the center line of the scanning beam passes through the forward focus 65 of the objective lens and therefore, after having passed through the objective lens 61, it becomes parallel to the optical axis and impinges on the mask and wafer perpendicularly thereto. If the location on which the scanning beam has impinged is a flat portion, the incident light is reflected and again returns to the position 65. On the other hand, if there is a pattern at the location on which the scanning beam has impinged, the light will be scattered by the edge of the boundary portion of the pattern and will not return. That is, the scattered light is captured by the objective lens 61 and when it again passes through the pupil 60, it no longer passes through the center 65 of the pupil but passes through the edge of the pupil. This means that the scattered light and non-scattered light are spatially separated on the pupil. Description will hereinafter be made of a detecting system for detecting such scattered light.

A photoelectric detecting optical system branching off from the beam splitter 57 to a photodetector 67 will be considered. In FIG. 5, reference numeral 68 designates a lens for imaging the pupil 60 of the objective lens 61, and reference numeral 69 denotes a filter for passing a photoelectric detecting light therethrough and substantially cutting light of other wavelength, for example, the wavelength used in the visual confirming optical system. Position 70 is a place whereat the image of the pupil 60 is formed by the pupil imaging lens 68. Here is provided a light-intercepting plate 70 for passing only the scattered light therethrough and blocking the non-scattered light. The non-scattered light passed through the light-intercepting plate is again condensed by a condenser lens 71 and enters the photodetector 67. Accordingly the pupil 60, the light-intercepting plate 70 and the photodetector 67 are in a conjugate relationship with one another. The light-intercepting plate can be readily prepared by patterning a transparent glass substrate 72 with a substance 73 such as a metal or chinese ink. In this photoelectric detecting system, an output appears only when the scanning spot comes near the edge portion of the pattern. Thus, if the output is observed in terms of time, it will be seen that a pulse-like signal is generated when the scanning beam has impinged on the edge.

In FIG. 5, an illuminating system 74 and an observation system 75 are provided for visual confirmation. In FIG. 5, reference numeral 76 designates an illuminating light source, and reference numeral 77 denotes a condenser lens which serves to form a light source image on the pupil 60 of the objective lens 61. Reference numeral 78 designates a filter having the function of cutting the light of a wavelength range to which photoresist is sensitized. Reference numeral 79 denotes an erector for effecting the erection of the image, reference numeral 80 designates a filter for cutting the laser wavelength and psssing therethrough the wavelength for visual observation, and reference numeral 81 denotes an eyepiece.

Figure 6:
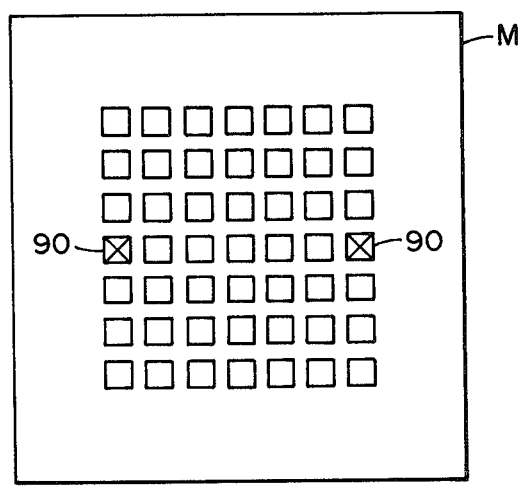
FIG. 6 shows a mask.
Figure 7:
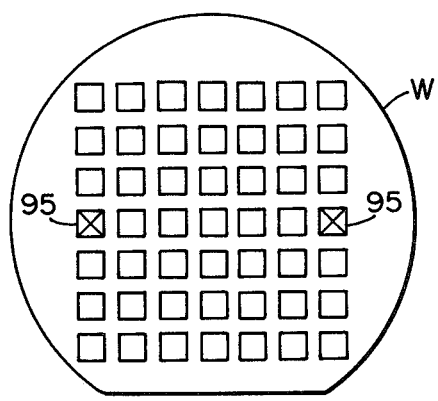
FIG. 7 shows a wafer.
Figure 8:
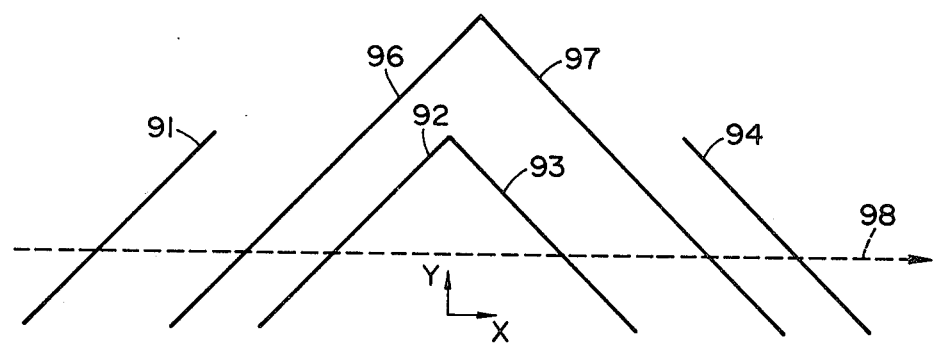
FIG. 8 shows alignment marks.
Figure 9:
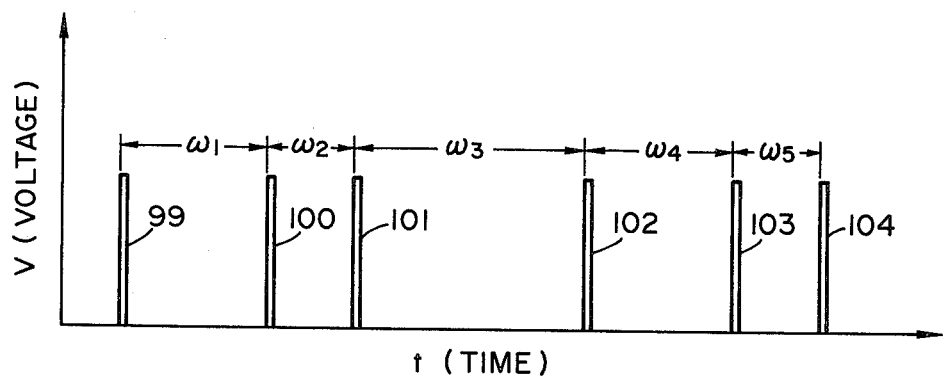
FIG. 9 shows a photoelectric output.

The mask M and wafer W will now be described by reference to FIGS. 6, 7 and 8. The mask M is shown in FIG. 6. In the left and right portions 90 of the mask, there are formed alignment marks by bar edges indicated at 91, 92, 93 and 94 in FIG. 8. Also, in the left and right portions 95 of the wafer W shown in FIG. 7, there are formed alignment marks by bar edges indicated at 96 and 97 in FIG. 8. When the mask and wafer are read along a scanning line 98 by the use of two series of photoelectric detecting systems shown in FIG. 5, there are obtained edge signals 99–104 as shown in FIG. 9. From the intervals $W_1$-$W_5$ between these edge signals 99–104, the deviations X, Y and $\theta$ between the alignment marks can be calculated by the use of a formula which will later be described.

The wafer supporting means 41 will now be described by reference to FIG. 10. The Figure is roughly divided into two portions, that is, the group on a parallel movement drive unit 251–264 and the group on a stage 276 having a drive unit moved by said parallel movement drive unit.

Designated by 251 and 256 in the parallel movement drive unit are X and Y driving step motors. The result of the signals obtained by the aforementioned optical system having been processed by a circuit to be described is sent to the step motors 251 and 256 as an input in the form of a drive pulse number. Designated by 252 and 257 are gears directly connected to the shafts of the step motors and connected to 253 and 258. The centers of rotation of 253 and 258 are 254 and 259 and with these as the fulcrums, rollers 255 and 260 are urged to move a substage 263 for X and Y parallel movement. That is, the substage 263 is first driven by the parallel moving drive signal of a pulse motor. Designated by 264 is a vacuum clutch which effects the changeover between the manual operation and the operation of moving the relative position of the mask pattern and wafer pattern after one exposure by a predetermined amount. The vacuum clutch 264 may be locked when a predetermined amount of movement takes place, and functions to transmit X and Y drive signals to a main drive stage 279 through an arm 280.

Under the stage 279, there are grooves 265 which provide driving guides, and bearings 266 are enclosed in the grooves. By the action of these guides, the drive of X and Y pulse motors 256 and 251 are accurately transmitted to the stage. A stage 258 capable of driving the direction of rotation is incorporated in the stage 279. A wafer supporting chuck and wafer are placed on the stage 268 and thus, the wafer is moved. The wafer is indicated by dotted line in the stage 268. Parallel movement of the stage 268 is controlled by rollers 267 provided at three locations on the stage 279. A driving step motor is designated by 275. The rotation of a gear 274 mounted on the rotary shaft of the motor is transmitted through a gear 273 to a worm gear 272 coaxial therewith, and further drives a gear 271. A guide 270 is mounted on the gear 271, and a pin 269 studded in the stage 268 is fitted in the guide. By moving this pin 269 nipped in the guide, the stage 268 may be rotated to correct the rotation of the wafer.

As generally described above, in the present embodiment, the Y and X drives are realized in the form that motors are placed on the X and Y drive stage. The stage 268 is provided with a number of air bearing nozzles 285 which may be used when the wafer is discharged. The air bearings are set so as to move the wafer to the left by blow-out of air as viewed in the Figure, and the wafer is directed toward a discharge bed 283 by blow-out of air. The discharge bed 283 is also provided with a number of air blow-out ports 284 to move further leftwardly the wafer fed from the stage 268. A guide frame 286 is mounted around the discharge bed 283 and accordingly, when air is blown up, the wafer stays at the left-hand side of the discharge bed. Also, when the wafer is to be carried in, that is, to be fed to under the mask pattern, a pick-up arm 281 having a rotating mechanism picks up the wafer from a wafer stay bed 287 through vacuum adsorption rubber 282, rotates rightwardly and leaves the wafer on the stage 268.

An electric circuit will now be described by reference to FIGS. 11A and 11B. Reference numeral 300 designates a so-called microcomputer which may be, for example, 8-bit microprocessor unit MPUM6800 produced by Motorola, Inc., United States, reference numeral 301 denotes a read only memory ROM which may comprise, for example, a necessary number of models 2716 produced by Texas Instrument, Inc., United Stages, reference numeral 302 designates a random access memory which may be, for example, model 6810 produced by Motorola, Inc., and reference numeral 303 denotes a so-called input-output controller IOC which may comprise, for example, a necessary number of peripheral interface adapters 6821 produced by Motorola, Inc. Detailed information on MPU300, RAM302, IOC303, etc. can be obtained by seeing Motorola Pamphlet M6800 microcomputer System-Design Data.

Designated by 304 is an exposure amount setting switch. The circuit of FIGS. 11A and 11B further includes a timer 305 for determining the exposure time, a shutter 306, an autohand unit 307 for effecting the supply of wafers, a discharge unit 308 for discharging the wafer after printed, a dual exposure mode switch 309 for selecting whether dual exposure is to be effected, a predetermined amount setting switch 310 for deviating the relative position of mask and wafer after the first exposure, photoelectric detectors 311-1 and 311-2 for detecting an auto alignment signal, amplifiers 312-1 and 312-2, waveform reformer circuits 313-1 and 313-2, timing circuits 314-1 and 314-2, pulse term detector circuit 315-1 and 315-2, and memory circuit 316-1 and 316-2 for memorizing the values of five intervals. Designated by 317 is a step motor driving circuit for driving the wafer stage. 317-1 is X step motor pulse count signal, 317-2 is Y step motor pulse count signal, 317-3 is $\theta$ step motor pulse count signal, and 317-4 is drive end signal.

Reference numeral 318 designates an X step motor, reference numeral 319 a Y step motor, and reference numeral 320 a $\theta$ step motor. Reference numeral 321 denotes an offset amount setting switch, and reference numeral 322 an alignment mode selecting switch for selecting manual alignment or auto alignment. MPU300 reads out fixed programs written in the ROM301, one after another, and effects the necessary control of input and output operations through IOC303 while executing a predetermined sequence, and effects the position adjustment and printing of wafer and mask. IOC303, as previously described, has the function of controlling the give and take between MPU300 and external devices such as exposure amount setting dial 304, timer 305, shutter 306, etc.

Operation of the present apparatus will now be described along the flow chart shown in FIGS. 12A, 12B, and 12C.

Step 1 is a step at which wafer is supplied to under the mask pattern. At this step, the autohand 281 picks up an unprinted wafer placed on the wafer stay bed 287 of FIG. 10, upon reception of the instruction from MPU300, rotates rightwardly to place the wafer on the wafer stage 268, and again rotates leftwardly to its original position.

Step 2 is a step at which the detecting optical system 49 for detecting the alignment marks of mask and wafer is returned. At this step, an objective take-in-and-out unit 323 operates upon reception of the instruction from MPU300 in the same manner as described previously. Step 3 is a step at which the offset amount as well as the value of the offset amount setting switch is introduced into MPU300 through IOC303. The offset will hereinafter be described. During the manufacture of a mask, a real element pattern is printed in step-and-repeat fashion, but a two-stage procedure is gone through in which the alignment mark portion is skipped over because it differs in the pattern to be printed and only the mark portion is newly printed. When this alignment mark is printed separately, a deviation is unavoidably created between the mark and the real element because of the problem of accuracy. That is, even if the alignment marks of mask and wafer are directed into a predetermined relation, the important real element creates a deviation (this is referred to as the offset amount). That is, when auto alignment is actually effected, the value of the offset amount setting switch 321 is introduced into MPU300 in advance and the real element is purposely deviated by an amount minus that offset amount.

The offset amount is independent to left and right and has X and Y components in each, but herein only X and Y components, namely, $\Delta X_{OFF}$ and $\Delta Y_{OFF}$, will be described.

Step 4 is a step at which the measured values of pulse terms $w_1-w_5$ are input. These values can be obtained from the scanning signals detected by the two photoelectric detectors 311-1 and 311-2 of FIG. 11. The scanning signals detected by the photoelectric detectors 311 are suitably amplified by amplifiers 312, and thereafter input to timing circuits 314 and waveform reformer circuits 313. The timing circuits 314 generate timing signals indicative of the start and end of the measurement, and these timing signals control the pulse term detector circuits 315 and memory circuits 316.

The waveform reformer circuits 313 convert and reform the analog scanning signals into digital signals shown in FIG. 9. In FIG. 9, reference numerals 99-104 designate signals obtained from the intersections between the alignment marks 91-94, 96, 97 shown in FIG. 8 and the scanning of the laser spot light.

The pulse term detector circuits 315 are circuits for measuring the five pulse terms $w_1, w_2, w_3, w_4, w_5$ shown in FIG. 9, and comprise counters or the like. Accordingly, each time the laser beam finishes scanning the alignment marks (shown in FIG. 8) on the mask and wafer, five pulse terms are input to the memory circuits 316 and therefore, MPU300 introduces the values thereof thereinto through IOC303. Step 5 is a step at which the deviation amount of the relative positional relation between the mask and wafer is calculated from said five pulse terms $w_1-w_5$. If complete alignment (zero deviation amount between the standard point of the mask and the reference point of the wafer) has been accomplished when the alignment marks 96, 97 on the wafer lie at a position bisecting the distance between the alignment marks 91, 92 and 93, 94 on the mask, the relation between the deviation amount of the wafer mark with the alignment marks on the mask as the reference and the pulse terms will be given by the following equations:

$$\Delta X = \tfrac{1}{4}(w_1 - w_2 + w_4 - w_5) \tag{1}$$

$$\Delta Y = \tfrac{1}{4}(-w_1 + w_2 + w_4 - w_5) \tag{2}$$

where $\Delta X$ is the deviation amount in the x-axis direction, namely, the deviation amount in the X direction of the reference point, i.e. the wafer mark with respect to the mask standard point, and $\Delta Y$ is the deviation amount in the y-axis direction, namely, the deviation amount in the Y direction of the reference point, i.e. the wafer mark with respect to the mask standard point, and these values are calculated by effecting an operational process in MPU300.

Step 6 is a step at which real deviation amounts $\Delta X_T$, $\Delta Y_T$ corresponding to the adjustment accuracy of the real element pattern are calculated also is MPU300. That is, values equal to the deviation amounts $\Delta X$, $\Delta Y$ measured from the alignment mark, minus the offset amounts $\Delta X_{OFF}$, $\Delta Y_{OFF}$, are calculated.

The calculation formulas are:

$$\Delta X_T = \Delta X - \Delta X_{OFF}$$

$$\Delta Y_T = \Delta Y - \Delta Y_{OFF}$$

Step 7 is a tolerance discriminating step at which whether the real deviation amounts $\Delta X_T, \Delta Y_T$ are within tolerance value T which is an allowable alignment error is discriminated. Examples of the discrimination formulas are:

$$|\Delta X_T| \leq T$$

$$|\Delta Y_T| \leq T$$

If, at step 7, the discrimination is NO, that is, if the mask and wafer are not yet sufficiently aligned, the program proceeds to step 8.

Step 8 is a step at which the pulse number applied to pulse motors 318, 319, 320 for driving the wafer stage is calculated from the real deviation amount.

The wafer stage has three degrees of freedom as previously noted, and these are calculated at this step. The calculation formulas therefor are:

$$X = -\frac{1}{2}(\Delta X_{T1} - \Delta X_{T2})$$

$$Y = -\frac{1}{2}(\Delta Y_{T1} - \Delta Y_{T2})$$

$$\textcircled{H} = -\frac{1}{D}(\Delta Y_{T1} - \Delta Y_{T2})$$

where $\Delta X_{T1}$, $\Delta Y_{T1}$, $\Delta X_{T2}$ and $\Delta Y_{T2}$ are the real deviation amounts at the positions of the left and right alignment marks. D is the distance between the left and right alignment marks. X, Y and $\textcircled{H}$ are the pulse counts in the directions of x-axis, y-axis and rotation driven by the step motor.

Step 9 is a step at which the pulse count obtained at step 8 is imparted to a step motor driving circuit 317, X pulse count is imparted through signal line 317-1, Y pulse count is imparted through signal line 317-2, and $\textcircled{H}$ pulse count is imparted through signal line 317-3, all from MPU through IOC303.

If even one of X, Y and $\textcircled{H}$ is selected in driving, the step motor driving circuit 317 drives the step motor 318, 319, 320 corresponding thereto and also imparts a drive end signal 317-4 back to MPU300 through IOC303.

Accordingly, if certain deviation amounts $\Delta X_T$ and $\Delta Y_T$ exist, the wafer stage is driven so as to correct them at steps 8 and 9.

MPU300 again executes step 4 when it sees the drive end signal 317-4 generated. Thus, the steps of driving, measurement and discrimination are repeated, whereby alignment is terminated and the program proceeds to step 10.

Figure 12:
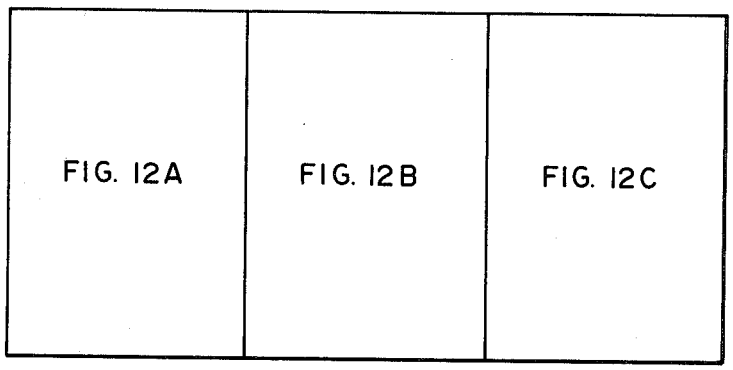
FIG. 12 shows how
Figure 12C:
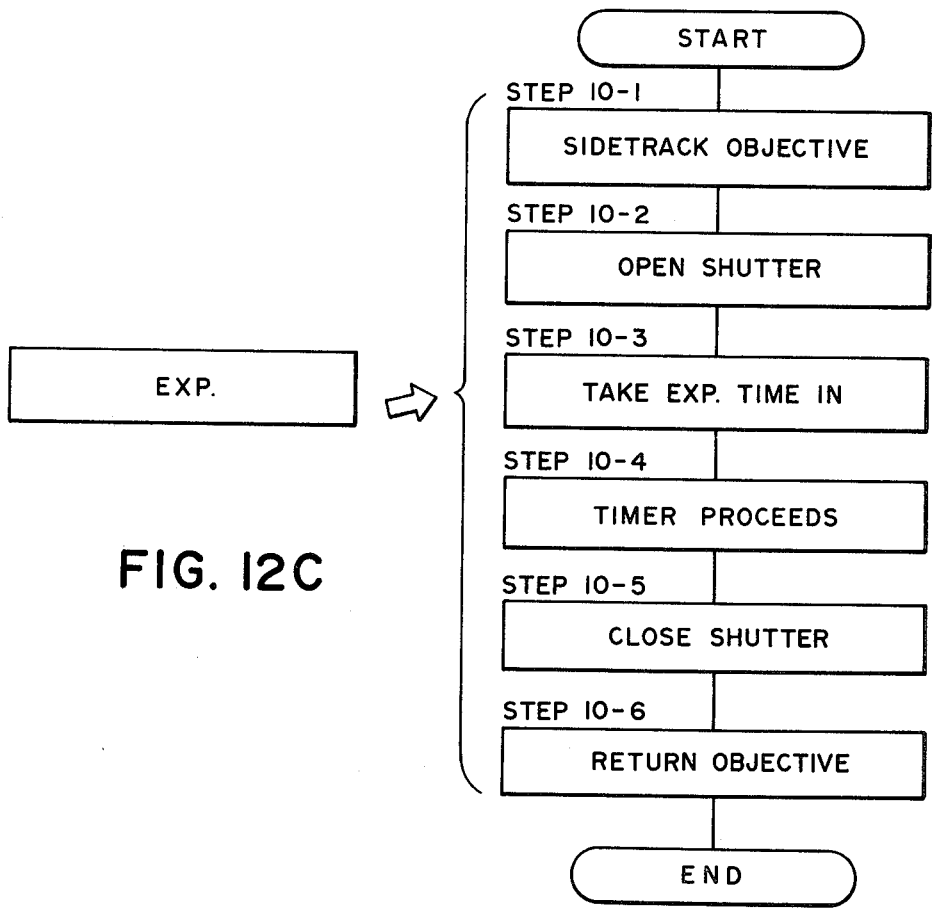
FIGS. 12A, 12B, and 12C are related to one another.
Figure 12A:
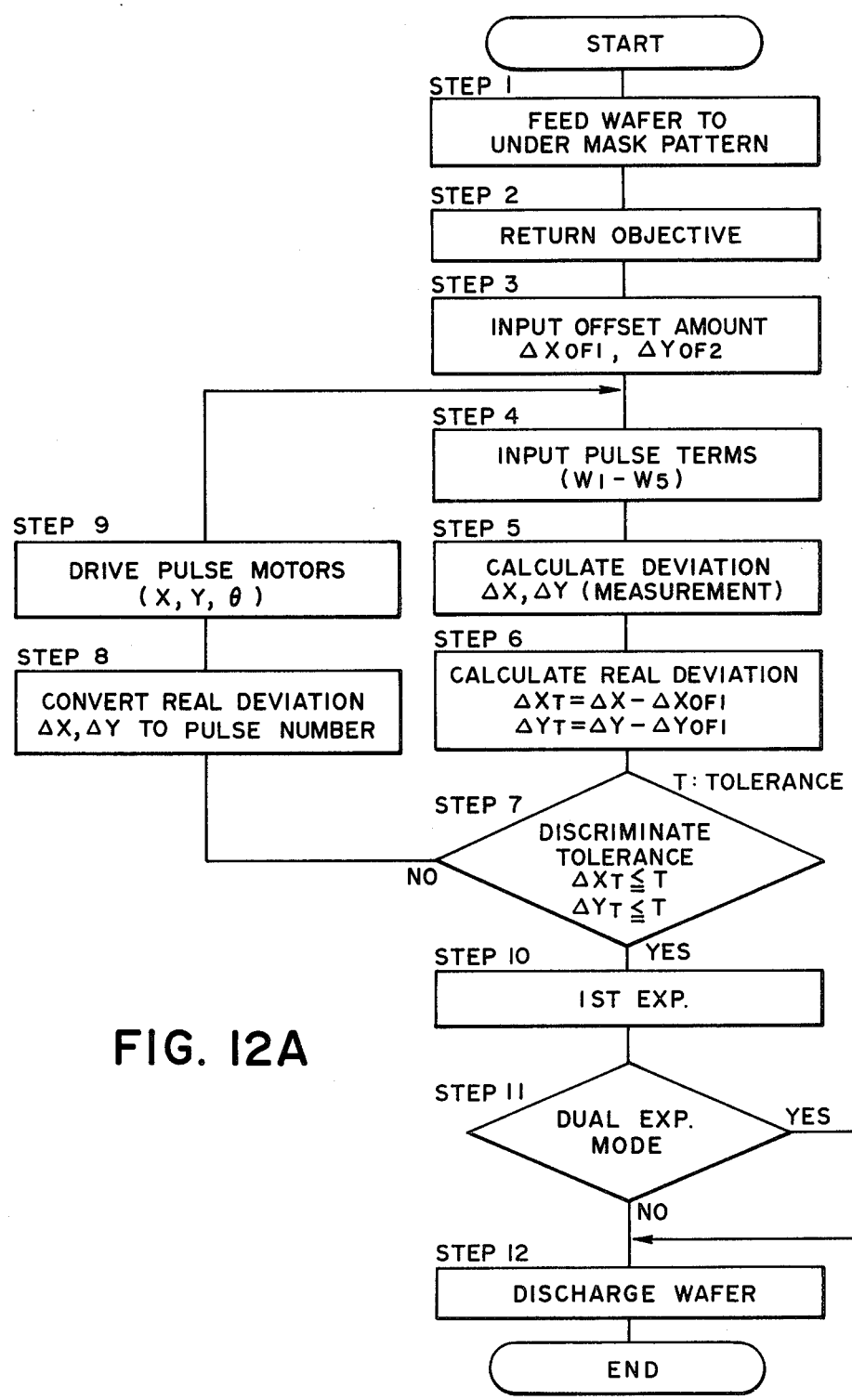
Figure 12B:
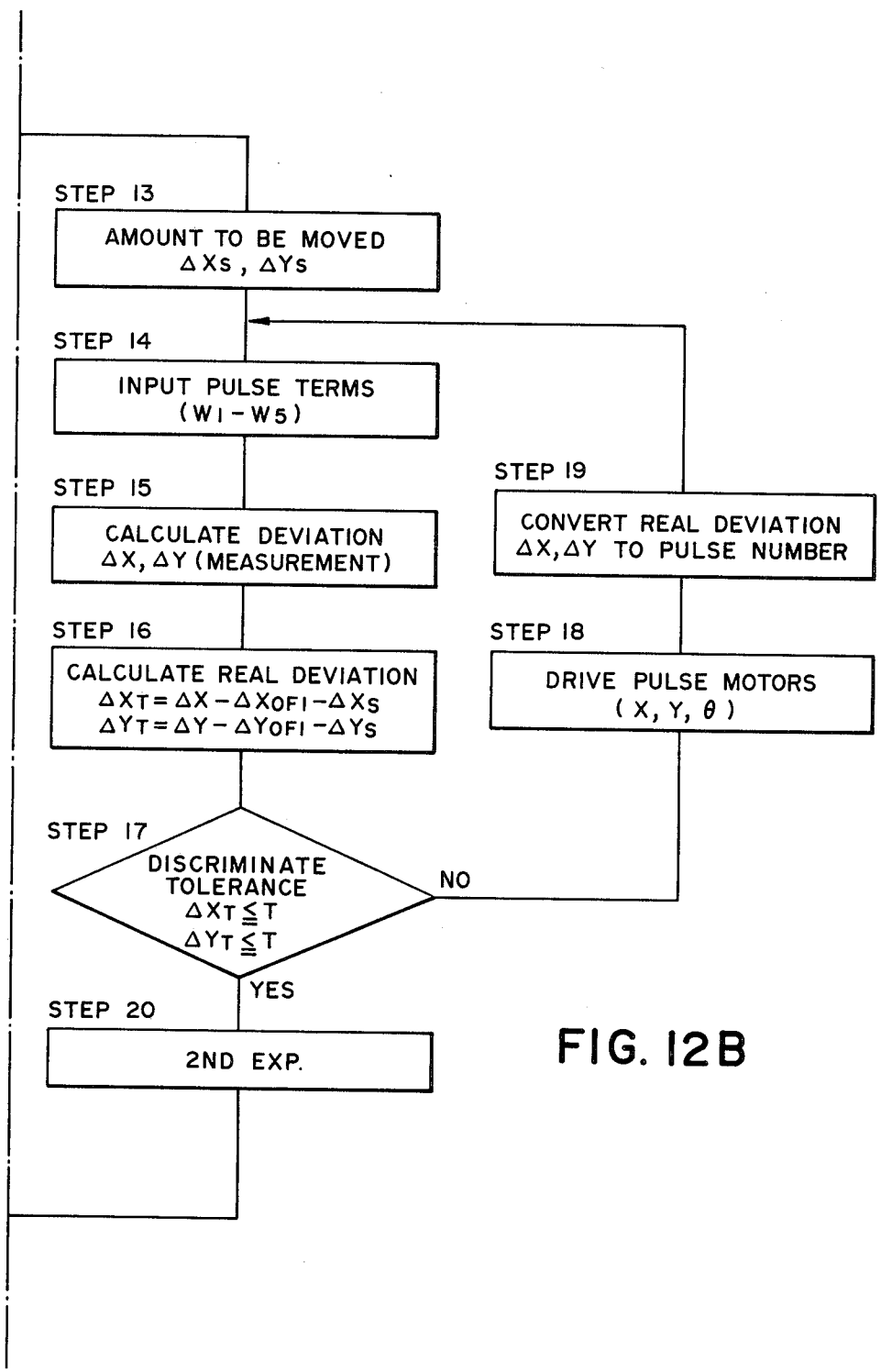

Step 10 is a step at which the first exposure is effected and at this step, the steps shown in the detailed flow chart of FIG. 12C are executed.

Step 10-1 is a step at which the objective lens lying on the mask and wafer is sidetracked, step 10-2 is a step at which shutter is opened to start exposure, step 10-3 is a step at which the value of the exposure amount setting switch 304 is taken in, the step 10-4 is a step at which the time proportional to the setting of switch 304 is obtained. At this step, the value of the switch 304 is imparted to timer 305 through signal line 305-1 and when a given time has elapsed, the timer 305 returns the termination thereof to MPU300 through signal line 305-2. When the timer termination is detected through IOC303, MPU300 causes the shutter 306 to be closed. In this manner, step 10 is terminated and the first exposure is terminated. In the flow chart of FIG. 3, it has been described that when the first exposure is terminated, the relative position of the mask and wafer is immediately deviated by a predetermined amount and the second exposure is effected, whereas in the present embodiment, design is made such that the mode in which the present apparatus is used as an ordinary printing apparatus, namely, the mode in which the wafer is discharged after a signal alignment and exposure, and the dual exposure mode of the present invention may be selected for use. Step 11 is a judgment step which determines the mode selection described just above. If the dual exposure mode switch 309 is set, the dual exposure mode will take place and if not so, ordinary one exposure mode will take place. Accordingly, MPU300 takes in the condition of the dual exposure mode switch 309 through IOC303 and effects judgment. If the dual exposure mode switch 309 is not set, the program proceeds to step 12 and the wafer is discharged. The wafer discharge is performed by MPU300 instructing the operation of the discharge unit which is the air bearing 284 of FIG. 10. Accordingly, if the mode is the ordinary one exposure mode, this completes the printing process.

If the switch 309 is in its set condition, the program proceeds to step 13 and proceeds to the dual exposure mode of the present invention. Step 13 is a step at which a predetermined amount making the relative positional relation between the mask and wafer differ from their previously aligned condition is taken into MPU300 from a predetermined amount setting switch 310 and is made into $\Delta X_S$ and $\Delta Y_S$. As a method of moving the mask or wafer by a predetermined amount, it would occur to mind (i) to directly drive the wafer stage by the predetermined amount, or (ii) to regard the predetermined amount as being of the same nature as the aforementioned offset and incorporate it into the loop of the detection drive of auto alignment. However, the method (i) requires the premise that the stage follows the drive amount. Accordingly, if any slight insensitive area such as back-lash exists in the stage, it is possible that the stage is not moved by the intended predetermined amount.

The present embodiment adopts the method (ii) to solve such problem.

Steps 14, 15, 17, 18 and 19 are entirely identical in substance to the aforedescribed steps 4, 5, 7, 8 and 9.

Step 16 differs from step 6 in the real deviation amount calculation formula. That is, since the predetermined amount is handled in the same manner as the offset, the real deviation amounts are calculated by subtracting (the offset amount+the predetermined amount) from the measured deviation amount.

If the real deviation amounts are $\Delta X_T$ and $\Delta Y_T$, the calculation formulas are:

$$\Delta X_T = \Delta X - \Delta X_{OFF} - \Delta X_S$$

$$\Delta Y_T = \Delta Y - \Delta Y_{OFF} - \Delta Y_S$$

where $\Delta X$ and $\Delta Y$ are the deviation amounts derived from the measured pulse terms, $\Delta X_{OFF}$ and $\Delta Y_{OFF}$ are the offset amounts, and $\Delta X_S$ and $\Delta Y_S$ are the predetermined amounts.

During the repetition of steps 14, 15, 16, 17, 18 and 19, the real deviation amounts $\Delta X_T$ and $\Delta Y_T$ do not fail to come into the tolerance value and the second alignment is terminated. If the alignment marks are visually observed in this condition, the relative position of the mask and wafer will be such that they are aligned with each other with a predetermined amount of deviation from the offset amount.

Step 20 is a step at which the second exposure is effected. This step is substantially the same as the first exposure and therefore need not be described in detail.

When the predetermined amount of deviation and the second exposure are thus terminated, the program proceeds to wafer discharge step 32, at which the wafer is discharged as previously noted and all the printing process is terminated.

What I claim is:

1. An apparatus for forming a mask pattern on a wafer and printing the mask pattern on the wafer, said apparatus comprising:
    a source of radiation energy for imparting a divided exposure radiation energy to a mask a plurality of times; and
    means for moving at least one of said mask and wafer relative to the other of said mask and said wafer for making the relative positional relation of the mask pattern and the wafer differ by a minute amount each time said divided exposure is effected.

2. An apparatus according to claim 1, wherein said moving means moves at least one of said mask and said wafer relative to the other thereof by an amount smaller than the line width of the mask pattern formed on the wafer.

3. An apparatus for forming a mask pattern on a wafer and printing the mask pattern on the wafer, said apparatus comprising:
    a source of radiation energy for projecting radiation energy to the mask;
    means for moving at least one of said mask and said wafer to slightly change the relative position of the mask pattern and the wafer;
    first exposure means for imparting radiation energy for exposure to a mask one time;
    second exposure means for imparting a divided exposure radiation energy a plurality of times, said moving means slightly changing the relative position of the mask pattern and the wafer each time the divided exposure is effected; and
    switching means for selectively actuating said first exposure means and said second exposure means.

4. An apparatus according to claim 3, further comprising wafer discharging means which operates after operation of said first exposure means or after operation of said second exposure means.

5. An apparatus for forming a mask pattern on a wafer and printing the mask pattern on the wafer, said mask and said wafer both having alignment marks thereon which when aligned indicate alignment of said mask and said wafer, said apparatus comprising:
    a source of radiation energy for imparting a divided exposure radiation energy to a mask a plurality of times;
    means for moving, each time the divided exposure is effected, at least one of said mask and said wafer to slightly change the relative position of the mask pattern and the wafer; and
    means for reading the alignment mark of the mask and the alignment mark of the wafer to detect the relative position thereof, and controlling said moving means in accordance with the detection.

* * * * *